US012709537B2

(12) United States Patent
Bogner et al.

(10) Patent No.: US 12,709,537 B2
(45) Date of Patent: Aug. 18, 2026

(54) SEMICONDUCTOR DEVICE

(71) Applicant: Infineon Technologies AG, Neubiberg (DE)

(72) Inventors: Andreas Bogner, Munich (DE); Christian Bretthauer, Munich (DE); Abhiraj Basavanna, Munich (DE)

(73) Assignee: Infineon Technologies AG, Neubiberg (DE)

( * ) Notice: Subject to any disclaimer, the term of this patent is extended or adjusted under 35 U.S.C. 154(b) by 381 days.

(21) Appl. No.: 18/337,176

(22) Filed: Jun. 19, 2023

(65) Prior Publication Data

US 2023/0416078 A1 Dec. 28, 2023

(30) Foreign Application Priority Data

Jun. 22, 2022 (EP) .................................... 22180506

(51) Int. Cl.
*B81B 3/00* (2006.01)

(52) U.S. Cl.
CPC .......... *B81B 3/0078* (2013.01); *B81B 3/0021* (2013.01); *B81B 2201/0235* (2013.01); *B81B 2201/0242* (2013.01); *B81B 2201/0285* (2013.01); *B81B 2203/0127* (2013.01)

(58) Field of Classification Search
CPC ..... B81B 3/0078; B81B 3/007; B81B 3/0021; B81B 2201/0285; B81B 2201/025; B81B 2203/0109
See application file for complete search history.

(56) References Cited

U.S. PATENT DOCUMENTS

2006/0272413 A1* 12/2006 Vaganov ................. G01P 15/18 73/514.01
2007/0037310 A1* 2/2007 Seto ...................... H10P 50/242 257/E27.006
2010/0242603 A1* 9/2010 Miller ....................... B81B 7/02 29/830
2012/0234093 A1* 9/2012 Black ................ G01C 19/5769 205/183
2015/0014796 A1* 1/2015 Dehe ..................... B81B 3/0021 257/416
2016/0023244 A1* 1/2016 Zhuang ................. B81B 3/0037 29/829
2016/0112808 A1* 4/2016 Geiger ................... H04R 31/00 381/113
2017/0115322 A1* 4/2017 Li ......................... G01P 15/125
2022/0155073 A1* 5/2022 Deng .................. H04R 19/005

FOREIGN PATENT DOCUMENTS

CN 213818178 U 7/2021

* cited by examiner

*Primary Examiner* — Moazzam Hossain
(74) *Attorney, Agent, or Firm* — Slater Matsil, LLP

(57) ABSTRACT

A semiconductor device has a deformable membrane, e.g., for the measurement of at least one of an acceleration, a vibration, or a pressure. The membrane has a supporting connection with a support structure which includes at least one elastic supporting connection. Also disclosed are a sensor device including the semiconductor device along with methods for manufacturing the semiconductor device and the sensor device.

20 Claims, 10 Drawing Sheets

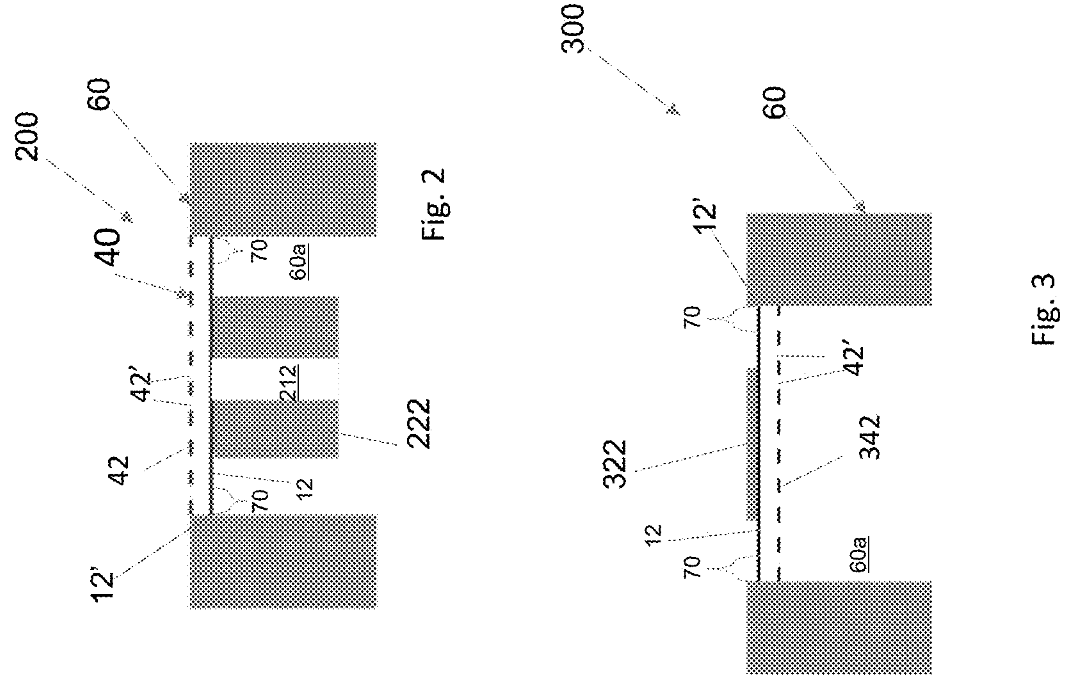
200
60
40
42'
42
12'
70
12
212
222
60a
Fig. 2
300
60
12'
70
42'
342
322
12
60a
Fig. 3
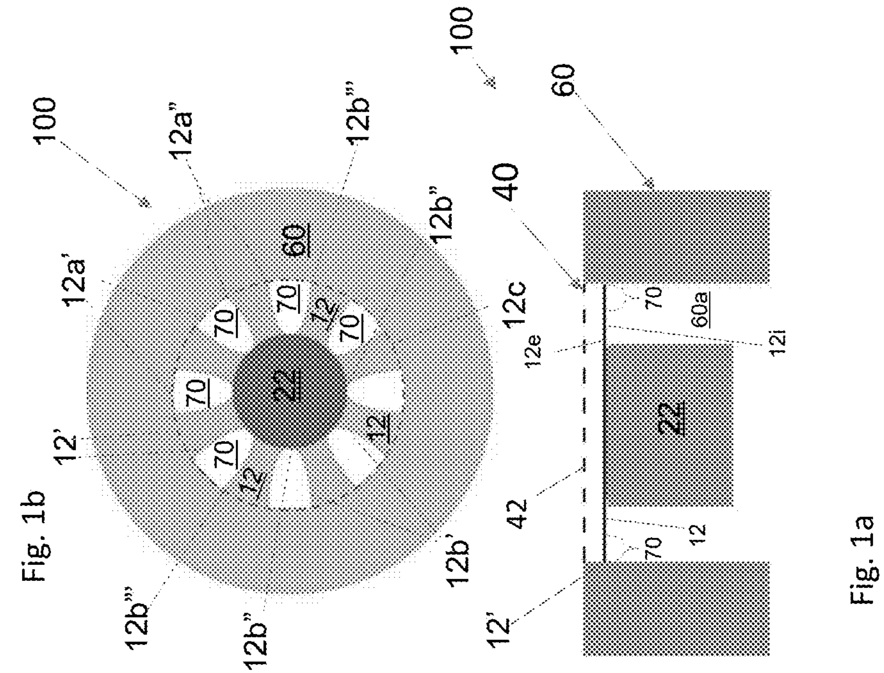
Fig. 1b
100
12a"
12b'''
12a'
12b"
60
70
12
12c
22
12'
12b'
12b'''
12b"
100
60
40
60a
12e
12i
42
12'
Fig. 1a 100
12'
12
22
70

12a''
12b'
12b''
12i

12a'
22
60a
60

12e 1000
1022
60'
70
1032a
22
1032
1035
1024
1034
60"

1100
1122
60'
70
1035b
1032
1024
1034
22
60"
Piezoelectric layer
1200
1222

60'
60"
70
1034"
1032
1035b'
22
1035b"
1034'
1030a
1024
70
60
1000

12'
12b'

1122
60
70
1100

SEMICONDUCTOR DEVICE

This application claims the benefit of European Patent Application No. 22180506.2, filed on Jun. 22, 2022, which application is hereby incorporated herein by reference.

TECHNICAL FIELD

The present disclosure relates generally to electronic devices, and more specifically relates to a semiconductor device.

BACKGROUND

A micro-electro mechanical system (MEMS) semiconductor device with a deformable membrane, for the measurement of an acceleration, a vibration, or a pressure, may have one mass element attached to the membrane. Under the effect of a pressure, acceleration or vibration, the mass element may move, thereby deforming the membrane. Information on the membrane's deformation is provided through an electric signal, e.g. through a capacitive, piezoelectric, or piezoresistive technique.

In particular for high vibration sensitivity and low noise the mass element shall have a large mass. Unfortunately, the larger the mass, the lower the robustness. In addition, the mass radius affects the mechanical stiffness. In order to increase mass without changing the stiffness, the mass element should have an elongated shape. However, with this solution the barycenter (center of mass) of the mass element is distant from the membrane, which tends to cause unwanted tilting modes. The tilting modes cause the membrane not to vibrate properly, and insert unwanted resonances in the electric signal.

Moreover, techniques (e.g., etching, such as Bosch etching) normally used for making the mass element often do not have enough precision to make such elongated mass elements. Therefore, either different techniques should be used, or the stockiness of the mass element should be increased. However, this increases stiffness, exacerbating the issues discussed above.

Techniques are needed for coping with these issues in forming mass elements and MEMS semiconductor devices containing such mass elements.

SUMMARY

In accordance with an example, there is proposed a semiconductor device comprising: a deformable membrane; a support structure, the deformable membrane being connected to the support structure through at least one supporting connection, wherein the at least one supporting connection includes at least one elastic supporting connection; at least one electric contact to obtain an electric signal indicative of the deformation of the deformable membrane; and at least one mass element attached to, or integral with, the deformable membrane.

Thanks to the elasticity of the supporting connection, the stiffness is reduced, and the dis-placement of the at least one mass element can be increased, notwithstanding elongating its shape too much.

In accordance with an aspect, the deformable membrane may be partially inserted in (or may be partially integral with) the support structure. The deformable membrane may be partially separated from the support structure so that at least one aperture is defined by the deformable membrane and the support structure, thereby forming an elastic supporting connection. The deformable membrane may be partially enclosed in (or at least partially in contact with) the support structure, while the membrane border may also be separated (for some portions) from the support structure. This may be one technique which permits to increase elasticity of the supporting connection of the deformable membrane. A fluid communication between two environments separated by the membrane is also achieved. It has been noted that it is therefore possible to achieve an adequate ventilation between the two environments separated by the deformable membrane.

In accordance with an aspect, at least one mass element may partially overlap with at least one aperture. Accordingly, the at least one aperture covered by the mass element results partially (but not totally) covered by the mass element. It has been understood that, accordingly, the stockiness of the shape of the at least one mass element may be increased (and the elongation is therefore reduced), thereby reducing the tilting effects even more, without increasing stiffness.

In accordance with an aspect, there may be provided at least one flap separated from the deformable membrane and supported by the support structure, each flap partially occupying, or otherwise overlapping with, at least one aperture. The flap may protrude from the support structure towards the deformable membrane, without contacting the membrane. Accordingly, the area of the aperture which permits the ventilation between the two environments separated by the membrane can be regulated.

In accordance with an aspect, there may be provided one single mass element (e.g., in central position of the deformable membrane). If the mass element is single in number, in theory tilting modes may occur. However, by reducing the elongation (but keeping the mass high, e.g. in consequence of the protrusion over the aperture and/or by increasing stockiness of the shape of the mass element), even one single mass element can become appropriated. In some cases, it is possible to regulate the mass element by making a central hole in the mass element, so as to achieve the desired mass necessary for the particular requested fundamental mode resonance.

In accordance with an aspect, at least one mass element may be in metal material. This is extremely advantageous, because metals have higher density than materials traditionally used for the mass elements. Hence, the elongation may be further reduced, and the tilting modes are even further reduced. It is the elasticity of the supporting connection which permits to use metal, which was traditionally avoided because of the problems of stiffness.

In accordance with an aspect, the at least one mass element may have a thickness less than 300 μm (micrometers), in particular when in semiconductive material (e.g., silicon-based material), thereby achieving an appropriate stockiness, further reducing the tilting modes. When in metal material, the at least one mass element may have a thickness less than 100 μm (micrometers), or more preferably less than 50 μm (micrometers), or even more preferably between 1.5 μm (micrometers) and 30 μm (micrometers), and even more preferably between 1.5 μm (micrometers) and 20 μm (micrometers).

In accordance with an aspect, the at least one mass element may be subjected to a movement to generate, as a resultant, at least one translatory oscillating mode (piston mode), oscillating according to a line transverse (e.g., normal) to the deformable membrane (to the line of the deformable membrane when the deformable membrane is in its unsolicited or undeformed position). The piston mode is preferred over the tilting mode. In accordance with an aspect, the center of mass (barycenter) of the mass element is in centered position of deformable membrane. In case of the plurality of mass elements, the center of mass is the center of mass of all the mass elements together (which may be outside of any of the mass elements), and is in central position of the membrane.

According to an aspect, the deformable membrane may include corrugations (e.g., placed between the aperture(s) and the mass element, to increase elasticity.

According to an aspect, the semiconductor device may comprise a capacitor with variable capacitance and with at least one first electrode and at least one second electrode. The first electrode may include the deformable membrane. The capacitance is varied in consequence of the membrane's deformation conditioned by the movement of the plurality of mass elements. The electric signal is therefore conditioned by the capacitance, and, accordingly, by the membrane's deformation (and therefore follows the acceleration, vibration, pressure experienced by the deformable membrane and the at least one mass element).

According to an aspect, the at least one second electrode may include a backplate (or a second electrode) keeping in place the deformable membrane through at least one support post. The backplate (or the second electrode) may be stiff. In operation, the deformation will interest the deformable membrane, while the backplate (or the second electrode) will not move.

According to an aspect, the deformable membrane may be included a piezoelectric deformable membrane (e.g., at least one piezoelectric layer) electrically connected to the at least one electric contact. The deformation of the deformable membrane (and in particular of the at least one piezoelectric layer), conditioned by the movement of the plurality of mass elements, causes the variation of the electric signal. The electric signal is therefore conditioned by the deformation of the deformable membrane (and therefore follows the acceleration, vibration, pressure experienced by the deformable membrane and the mass elements).

According to an aspect, the deformable membrane may operate as a resistor with variable resistance (e.g., in piezoresistive material), being subjected to a flow of electric current. The electric signal is conditioned by the deformation of the deformable membrane conditioned by the movement of the at least one mass element. Therefore, the resistance follows the acceleration, vibration, pressure experienced by the deformable membrane and the mass elements.

According to an aspect, there may be provided a sensor device comprising a semiconductor device as above or below, further comprising: analog-to-digital circuitry to convert the electric signal indicative of the deformation of the deformable membrane onto a digital version; and at least one digital measurer to obtain, from the digital version of the electric signal, a measurement of at least one pressure, vibration, or acceleration.

The sensor device, which may be, or be part of, a voice pickup unit (VPU), for example, may also include a plurality of semiconductor devices (e.g. as above) with different displacements, weights, shapes, of the mass elements (e.g., each of them being particularly sensitive to a particular acceleration range, vibration range, or pressure range, so that a plurality of different electric signals are obtained simultaneously, and the acceleration, vibration, or pressure is measured with increased precision through signal processing involving the different electric signals obtained simultaneously.

According to an aspect, there is provided a method for manufacturing a semiconductor device, the method comprising: making a support structure, and a deformable membrane supported by the support structure through at least one supporting connection, in such a way that the at least one supporting connection includes at least one elastic connection, the at least one mass element being attached to (e.g., integral with, or clamped to, held by, supported by, etc.) the deformable membrane; and electrically connecting the deformable membrane to circuitry, the circuitry being configured to acquire an electric signal indicative of the deformation of the deformable membrane conditioned by the movement of the at least one mass element.

According to an aspect, the at least one mass element may be in metal material, and may be obtained through metal plating or physical vapor deposition. Layer thickness defined by metal plating and physical vapor deposition are more precise than etching to a certain layer thickness.

According to an aspect, the semiconductor device may be a capacitor with variable capacitance, the capacitor having a first electrode and second electrode, the first electrode including the deformable membrane. The method may include making the second electrode before, and in a more internal position than, the deformable membrane, the method including making the at least one mass element more external than the deformable mem-brane (e.g., using layer growth or another technique).

BRIEF DESCRIPTION OF THE DRAWINGS

FIG. 1*a* shows a semiconductor device according to a first example and seen according to protrusion direction;

FIG. 1*b* shows the semiconductor device of FIG. 1*a* in a planar directions;

FIG. 2 shows another example of a semiconductor device according to a protrusion direction;

FIG. 3 shows another example of a semiconductor device according to a protrusion direction;

DETAILED DESCRIPTION OF ILLUSTRATIVE EMBODIMENTS

Examples of micro electro mechanical system (MEMS) devices are discussed here below. Some embodiments of the present disclosure are directed to a semiconductor device having a deformable membrane, e.g., for the measurement of at least one of an acceleration, a vibration, or a pressure. Example embodiments also relate to a sensor device including the semiconductor device. Some embodiments also refer to a method for manufacturing the semiconductor device and the sensor device. In some embodiments, the semiconductor device may be a MEMS device.

FIGS. 1*a* and 1*b* show a semiconductor device 100. FIG. 1*b* shows the extension of the semiconductor device 100 along two planar directions (the two planar directions form a plane, or are parallel to a plane, on which the membrane, when unsolicited or undeformed, extends). FIG. 1*a* shows the extension of the semiconductor device 100 along one planar direction (represented as horizontal), along which a deformable membrane 12 extends, and a protrusion direction (represented as vertical), along which at least one mass element 22 protrudes. The semiconductor device 100 may be (or be part of) part of a voice pickup unit. The semiconductor device 100, in this case, operates as a capacitor with variable capacitance (it will be shown that there is the possibility of implementing the examples by operating a semiconductor device according to different techniques, e.g. piezoelectric, piezoresistive, etc.).

The deformable membrane 12 may be subjected to deformation (in particular by being deformed along the protrusion direction). The membrane 12 may sustain the at least one mass element 22. The semiconductor device 100 may have at least one or more mass elements 22 (one single mass element in the example of FIGS. 1*a* and 1*b*). Each mass element 22 may be, in some examples, a cylinder (or a prism) with height (thickness) elongated in the protrusion direction, and radius (or face) being elongated in at least one of the planar directions (other shapes are possible). The at least one mass element 22 may operate as inertial mass, providing a particular inertia to the membrane 12 (the particular inertia may be associated to a particular acceleration, vibration, or pressure to be sensed).

Figure 9:
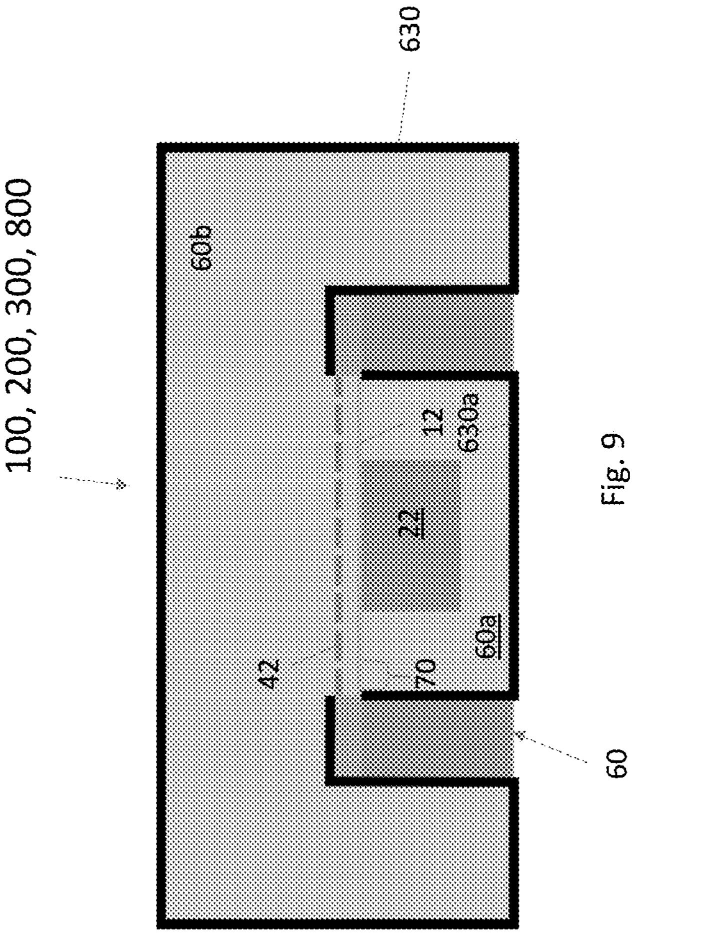
FIG. 9 shows a cross-sectional view in a protrusion direction of a structure (e.g., chip) comprising a device according to the present document.

A support structure 60 may form a chamber 60*a* (cavity volume), e.g. closed by the membrane 12 (it is noted that the chamber 60*a* may be a closed volume with a floor 630*a* which is not shown in the figures apart from FIG. 9). Even if not shown in FIGS. 1*a* and 1*b*, the support structure 60 may include a first block 60" and a cover 60' (see also below, in particular in FIGS. 6*a*, 6*b*, 8*a*, and 8*b*). As shown in FIG. 1*a*, the membrane 12 may have a first (internal) side 12*i* and a second (external) side 12*e* which are opposite with each other along the protrusion direction. The second (external) side 12*e* may be the side onto which the pressure to be measured is exerted, or in any case which is more exposed to an external environment. The first (internal) side 12*i* of the membrane 12 is the side from which the at least one mass element 22 is attached (e.g., suspended, fixed or integral thereto). The at least one mass element 22 may be, for example, in semiconductive material (e.g., silicone or a compound of silicone, such as polysilicon) or in metal material. The membrane 12 may be in a single layer or in a plurality of layers, stapled one on another. The membrane 12 may have a conductive layer (e.g., for obtaining the capacitor, see below) or may be in doped semiconductor material. The membrane 12 may have a disc shape, for example (e.g., a cylinder with diameter much greater than the height, which is the thickness of the disc) (but other shapes are possible). The membrane 12 may, in some examples, be planar, without corrugations.

The deformable membrane 12 may have a membrane border 12'. The membrane 12 may be clamped (or more in general attached, supported, etc.) in correspondence of the membrane border 12' (or at least in correspondence of some portions 12*a*" of the membrane border 12', see below). The deformable membrane 12 may be cantilevered to the structure 60. The deformable membrane 12 may be clamped to the support structure 60. The deformable membrane 12 may be held by the support structure 60. The membrane 12 may be secured to the support structure 60. The support structure 60 may operate as a holder. The membrane 12 may be at least partially inserted in the support structure 60, e.g. sandwiched between a cover 60' and a first part (first block) 60" (this is not shown in FIGS. 1*a*-3, but is shown in FIGS. 6*a*, 6*b*, 8*a*, 8*b*, etc.). The membrane 12 may be in polysilicon, or more in general a silicon based material (doped or non-doped, or with metal traces to make a conductor a capacitor, see below).

The supporting connection between the membrane 12 and the support structure 60 may be (or more in general include) an elastic supporting connection. The membrane 12 may be cantilevered to the support structure 60. In the case of FIGS. 1*a* and 1*b*, elasticity to the elastic supporting connection is achieved by reducing the contact between the border 12' of the membrane 12 and the support structure 60. This is obtained, in the example of FIGS. 1*a* and 1*b*, by generating at least one aperture 70 (e.g., a plurality of apertures 70) in the membrane 12 so that at least part of the membrane border 12' is, in some portions, not in contact with the support structure 60. In FIG. 1*b*, a closed line (e.g., circumference) 12*c* is shown, which is not in completely coincident with the membrane border 12'. Some arches 12*a*" of the closed line (e.g., circumference) 12*c* actually coincide with portions of the membrane border 12', but other arches 12*a*' (alternated to the arches 12*a*") do not coincide with the membrane border 12'. This because of the presence of the aperture(s) 70, and the fact that the membrane border 12' is not completely in contact with the support structure 60. More in general, the membrane 12 may be partially separated (along some portions of its border 12') from the support structure 60, so that at least one aperture 70 is defined between the membrane 12 and the support structure 60. An interspace (aperture 70) is therefore obtained between the membrane 12 and the support structure 60.

The membrane border 12' (which may extend along the planar directions) can be understood as including: at least one contacting membrane border portion 12*a*" which contacts (e.g., is inserted in, and/or held by, and/or connected to, and/or clamped to) the support structure 60 (and which may coincide with the closed line 12*c*, which may be a circumference); and at least one free membrane border portion 12*b*' which does not contact (e.g., which is not inserted in, and/or not held by, and/or not connected to) the support structure 60 (and which may not coincide with the closed line 12*c* delimiting the internal extension of the support structure 60).

The free membrane border portions 12*b*' may be alternated to the contacting membrane border portion 12*a*", e.g. periodically. The circumferential arches 12*a*' in FIG. 1*b* are not part of the membrane border 12'. The free membrane border portions 12*b*' may be partially oval (partially elliptical), for example, or more in general curve. The free membrane border portions 12*b*' may be angularly alternated to the contacting membrane border portion 12*a*", e.g. according to a regular angular succession.

More in particular in the example of FIGS. 1*a* and 1*b*, each contacting membrane border portion 12*a*" is a circumferential arch of the circumference 12*c*. In FIG. 1*b* each contacting membrane border portion 12*a*" is a circumferential arch of the circumference 12*c*; and at least one free membrane border portion 12*b*' is arcuate (and more in particular an elliptical arch) which does not contact the support structure 60, but which delimits the respective aperture 70.

By virtue of the presence of the aperture(s) 70, fluid communication is achieved. This permits, for example, an effective thermal exchange (ventilation) between the environments separated by the membrane 12. In general, it is preferable to have between 2 to 36 apertures. Each free membrane border portion 12*b*' (and each aperture 70) may have a summit 12*b*" (directed towards the central position of the membrane 12) which is arcuate, and/or may be convex (the membrane 12 being therefore concave, when see along the planar directions). Each free membrane border portion 12*b*' (and each aperture 70) may have at least two intersections 12*b*''' (vertexes) with the contacting membrane border portion(s) 12*a*' (which may be a sharp vertex, such as a cuspidal intersection). The arcuate (curved) shape of the summit 12*b*" of each aperture(s) 70 permits to increase elasticity and reduce stiffness, and to increase robustness. The fact that the vertexes 12*b*''' are sharp in the outer part of the aperture(s) (and of the membrane 12) is less stringent, because of the geometry of the membrane 12 and the structure 60. In particular, the at least one vertex 12*b*''' is less structurally solicited than the summit 12*b*", and can therefore be non-arcuate.

In examples, multiple apertures 70 may be present at regular intervals (e.g., at periodical angular intervals). For example, in FIG. 1*b* shows that the apertures 70 may be regularly angularly periodic (the angle vertexes being in the center of the membrane 12). E.g., in FIG. 1*b* the angular period is 45° (angle between two consecutive apertures 70), but different periodicities may be defined (they can be appreciated in FIGS. 5*a*-5*b*, see below). It is in some examples preferable that the membrane 12 has a symmetry (e.g., radial symmetry, axial symmetry, or both), which also requires the apertures 70 to be equal to each other and be placed at symmetrical positions (e.g., radially symmetrical positions, axially symmetrical positions, or both), so as to have the center of mass of the membrane 12 in central position in the membrane 12. In general terms, the at least one mass element may have the center of mass centered with the center of the membrane. (In the examples in which there are multiple mass elements for the membrane, the center of mass of the complex group of mass elements may be in the center of the membrane).

FIG. 1*b* shows the at least one aperture 70 to have an arcuate shape. The shape of each aperture 70 may be the geometrical intersection between: the internal surface of a plan figure (e.g. a circle) contained in the border 12*c* (e.g., circumference); and an ellipse (whose border is partially coincident with the free membrane border portion 12*b*') having the major axis (i.e. the axis passing through the foci of the ellipse) directed towards the center of the circle encircled by the circumference 12').

It has been understood that the angular period of the apertures 70 (e.g., in combination with the radial directions of their major axes and/or of the radial symmetry and/or axial symmetry of the apertures 70) also permits to increase elasticity and decrease stiffness, in particular by virtue of the arcuate shape of the free membrane border portion 12*b*', in particular in proximity to the at least one mass element 22. Also, the fact that the shape of the aperture(s) 70 are convex (causing the membrane 12 to have a concave shape when seen in the planar directions) permits to increase elasticity and reduce stiffness.

In examples above and below, the at least membrane is mostly represented as smooth elements, which surfaces (e.g., 12*i*, 12*e* in FIG. 1*a*) which are planar. However, corrugations may be present in some examples. Corrugations may be, for example, concentric. Corrugations may be circumferential. Corrugations may be centered in the center of the membrane. Any of the examples below may include corrugations, to further increase elasticity, e.g. placed between the aperture(s) 70 and the at least one mass element 22. It is noted that, without the elastic connection (e.g., provided by the apertures 70), the effect of the corrugations would be too unreliable.

The semiconductor device 100 may comprise a capacitor 40 with variable capacitance, and the membrane 12 may be one first electrode of the electrodes of the capacitor. The other electrode of the capacitor may be a backplate 42, which may be placed in more external position than the position of the membrane (e.g., external to the chamber 60*a*, and/or facing the external side 12*e* of the membrane 12). The backplate 42 may have passing holes that permit fluid communication therethrough (e.g., so as the membrane 12 can experience the pressure of the external environment).

FIG. 2 shows a variant 200 of the example 100 of FIGS. 1*a* and 1*b*. Here, the only difference is that the single mass element 222 has a central hole 212 (while the mass element 22 of FIGS. 1*a* and 1*b* is a massive element, without holes). The hole 212 can be a through hole, but it does not need to be. The volume of the hole 212 is mainly determined by the inertial mass that the mass element 222 shall have. The center of mass of the complex system formed by the membrane 12 and the single mass element 222 is in in central position. The at least one mass element 222 may be, for example, in semiconductive material (e.g., silicone or a compound of silicone, such as polysilicon). The hole 212 may be obtained by etching (e.g., by Bosch etching). However, like the example in FIGS. 1*a* and 1*b*, the membrane 12 is connected to the structure 60 through the same elastic connection partially separated (in particular through apertures 70, which reduce the amount of elongation of the contacting membrane border portion(s) 12*a*" in contact with the support structure 60). It is to be noted that, despite etching (and in particular Bosch etching) being not necessarily a particularly precise technique (at least for the precision that the at least one mass element 222 shall have), the problem is diminished in view of the fact that the presence of the hole permits to increase the diameter of the at least one mass element 222, thereby reducing the precision issues (at small radii, precision becomes much more difficult to achieve). Even without increasing the radius, advantages are notwithstanding achieved in the process of manufacturing: the hole 222 permits to counteract mass radius deviations from wafer center to wafer edge by adjusting the hole radius properly from wafer center to wafer edge through mask layout. Therefore, the hole 212 permits to greatly increase precision of fabrication without too great effort.

FIG. 3 shows a variant 300 of the example of FIGS. 1*a* and 1*b*. Here, the at least one mass element 322 (in the specific case, a single mass element) is in metal material. Preferred metal materials are Cu, Al, W, TiW, but other metal materials may be used in some examples). Notably, the extension, along the protrusion direction (vertical in FIG. 3), of the at least one mass element 322 in metal material is reduced with respect to the examples in FIGS. 1*a*-2, because the metal has larger density than semiconductors. Moreover, the membrane 12 is external (the second electrode, backplate 342, which may also have through holes, is internal to the chamber 60 delimited by the structure 60 and the membrane 12). This is an advantage in the constructive method, since it is not necessary to perform Deep Reactive Ion Etching (DRIE) etching (which is a technique which often does not suite with the precision required for shaping the at least one mass element), and it is possible to use metal plating (e.g. electroplating) and/to electrodeposition, which are more precise techniques than etching. Like the examples of FIGS. 1*a*-2, the membrane 12 is connected to the structure 60 through the same elastic connection partially separated (in particular through apertures 70, which reduce the amount of elongation of the contacting membrane border portion(s) 12*a*" in contact with the support structure 60). It is by virtue of the elasticity of the connection between the membrane 12 and the support structure 60 that it is possible to use metal material for the at least one mass element 322, which otherwise could not be used, because a too thick metal layer would be required, and this would not be feasible with the current techniques. The thickness of the at least one mass element 322 in metal material may be, for example, with the present technique, less than 100 μm (micrometers). The thickness of the at least one mass element 322 in metal material may be, for example, or more preferably less than 50 μm (micrometers), or even more preferably between 1.5 μm (micrometers) and 30 μm (micrometers), and even more preferably between 1.5 μm (micrometers) and 20 μm (micrometers). Even if FIG. 3 shows that the metal layer 322 is directed externally and that the second electrode 42 is more internal than the membrane 12, in examples one or both of these two features may lack. The metal layer may be used for example in an example link in FIG. 1*a* (but the metal mass element would simply have smaller elongation in the protrusion direction).

Figures 4A, 4B, 4C, 4D, 4E, 4F:
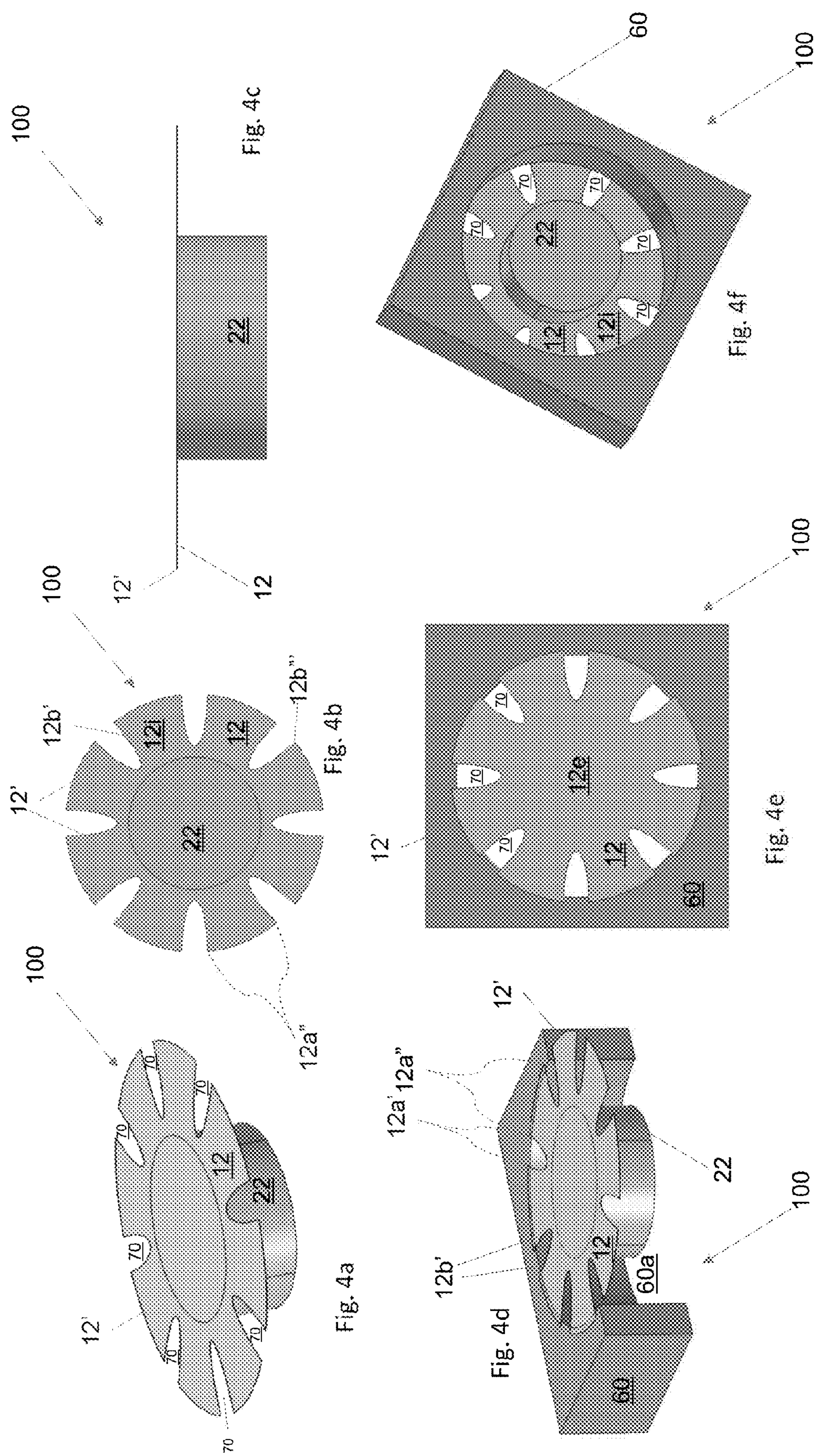
FIG. 4*a* shows a view in perspective of elements of an example, which can be one of the examples of FIGS. 1*a*-3)
FIG. 4*b* shows a view in the planar directions of the elements of FIG. 4*a;*
FIG. 4*c* shows a view along the protrusion direction of the element of FIGS. 4*a* and 4*b;*
FIG. 4*d* shows a view in perspective and partially cross-sectioned of the element of FIGS. 4*a*-4*c* with an additional support structure.
FIG. 4*e* shows a view along planar directions of the elements of FIG. 4*d;*
FIG. 4*f* shows a view in perspective of the elements of FIGS. 4*d* and 4*e;*

FIGS. 4*a*-4*f* show particulars of elements of examples above and below. Reference numerals for clarity are those of FIGS. 1*a* and 1*b*, but they may also be applied to the corresponding elements of the examples of FIGS. 2 and 3. FIG. 4*a* shows a view in perspective of the membrane 12 and the at least one mass element 22 (or 222 or 322). FIG. 4*b* shows a view along two planar directions of the membrane 12 and the at least one mass element 22 (or 222 or 322) from below (i.e. from the internal chamber 60*a*). FIG. 4*c* shows a view along the protrusion direction (represented as vertical) and one planar direction of the membrane 12 and the at least one mass element 22 (or 222 or 322). FIG. 4*d* shows a view in perspective, and partially cross-sectioned, of the membrane 12 (represented completely) and the at least one mass element 22 (or 222 or 322) (represented in cross section). FIG. 4*e* shows a view along two planar directions of the membrane 12 and the at least one mass element 22 (or 222 or 322) from above (i.e. from outside the internal chamber 60*a*). FIG. 4*f* shows a view in perspective of the membrane 12 and the at least one mass element 22 (or 222 or 322).

Figure 5B:
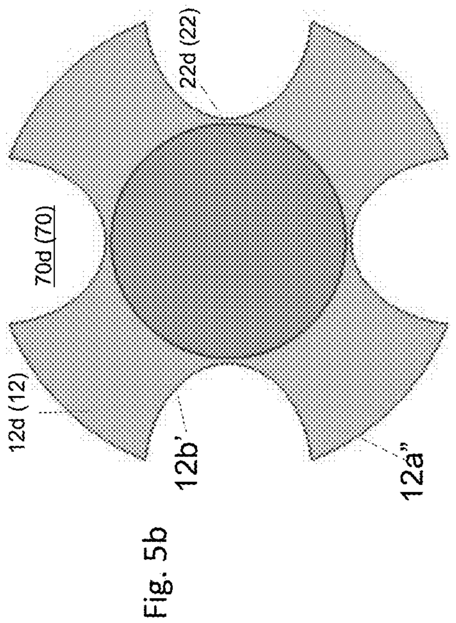
FIGS. 5*a* and 5*b* show examples of configurations of a membrane and at least one mass element according to examples.
Figure 5A:
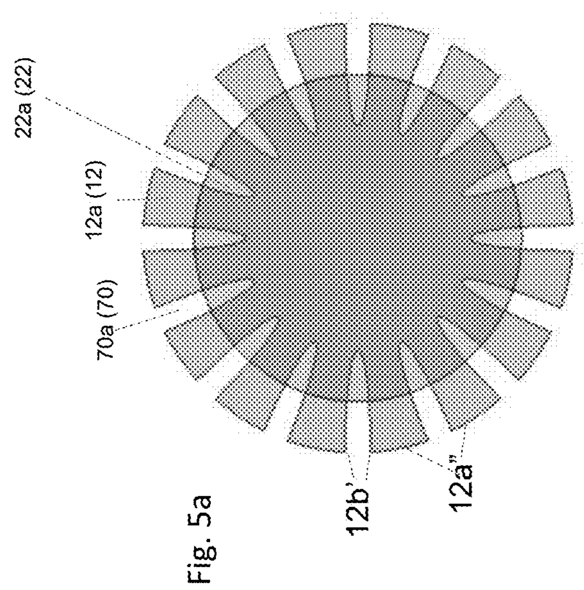

FIGS. 5*a*-5*b* also show examples of configurations of the membrane 12 (12*a* and 12*d*, respectively) and the at least one mass element 22 (22*a* and 22*d*, respectively) (in these cases, only one single mass element is present). As can be seen from FIG. 5*a*, another advantage of the present examples is that it is possible to make the at least one mass element 22*a* to partially cover the aperture(s) 70 (70*a*) of FIGS. 1*a* and 2. Therefore, the at least one mass element (22*a*) may protrude from the membrane 12 along at least one of the planar directions and partially overlap with the aperture(s) 70 (70*a*). This also increases the stockiness maintaining the elasticity provided by the apertures 70 (70*a*). Basically, in FIG. 5*a*, the ratio between the planar extension of the mass element (22*a*) and the planar extension of the membrane (12*a*) is increased with respect to that in the prior art, thereby increasing stockiness. In FIG. 5*b* the mass element 22*d* does not cover the apertures Tod. The example of FIG. 5*b* is more adapted to the mass element 322 in metal material, while the example of FIG. 5*a* is often better adapted for the semiconductor material. Any of the examples of FIGS. 5*a*-5*b* may also have a hole in the mass element (22*a* or 22*d*), e.g. as shown in FIG. 2, or more in general a through hole or a non-through hole.

Figure 8B:
FIG. 8*b* shows the device of FIG. 8*a* in a view according to planar directions.
Figure 8B:
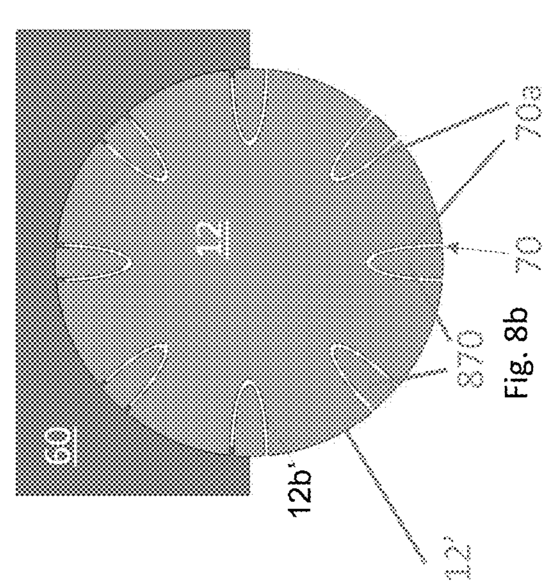
Figure 8A:
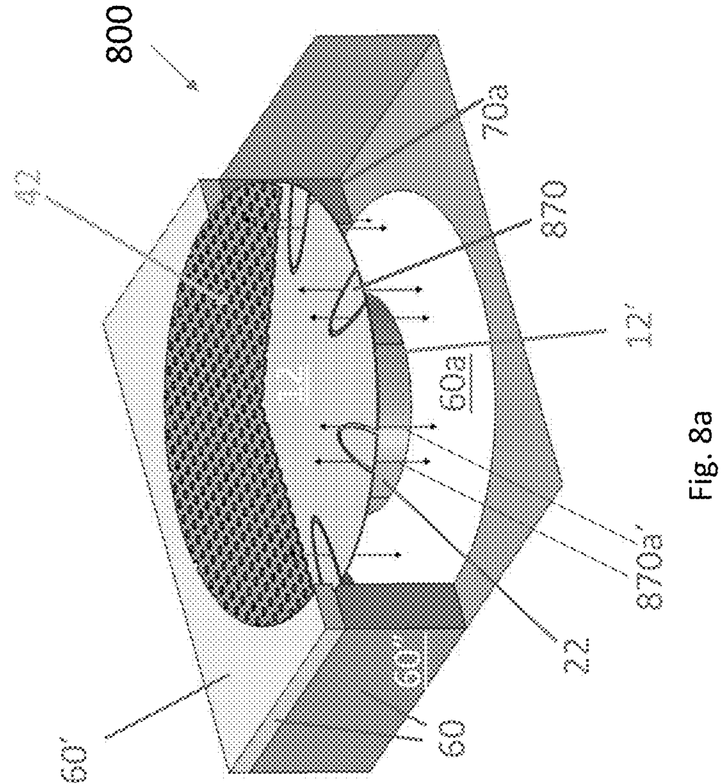
FIG. 8*a* shows another example of a device according to the present document in a partially cross-sectioned perspective.

FIGS. 8*a* and 8*b* show another variant in which the at least one aperture 70 is partially occupied by a flap 870 attached to (and/or fixed to, and/or held by, and/or integral in one piece with) the structure 60. The shape of each flap 870 may be similar to the shape of the shape of the aperture 70 which the flap 870 partially occupies, but in a reduced scale. The presence of the flap (only partially obstructing the fluid communication permitted by the aperture 70) reduces the volumetric flow of fluid through the at least one aperture 70. The at least one aperture 70 still permits the fluid communication through a slit 70*a* formed between a flap 870 and the membrane 12. Basically, each flap 870 has a border which faces the free membrane border portion 12*b*' of the particular aperture 70. The at least one flap 870 does not participate to the vibration of the membrane 12, since it is detached from the membrane 12 (and is fixed to the structure 60). However, the fluid communication through the at least one aperture 70 is notwithstanding guaranteed, as indicated by the arrows 870*a*' in FIG. 8*a* (through the slits 70*a*). This solution permits an adequate fluidic mass exchange through the slits Toa, without exaggerating, and also permits to maintain the elasticity required. The flap(s) 870 control the fluidic damping through the aperture(s) 70 (in particular through the slit(s) 70*a*) and adjust the stiffening effect of the chamber 60*a*. This permits to reduce the Q-factor of the fundamental mode of the vibration and the total noise to result, thereby reducing disturbance for the frequency response. It is also noted that the slit(s) 70*a* may also be made by removing (e.g., by etching) portions of the membrane 12, therefore simplifying the manufacturing process.

FIG. 9 shows a broader view of the semiconductor device 100, 200, 300, 800 (or those in FIG. 5*a*-5*b*, or some which are below). Here, it is shown that the support structure 60 is fixed to an external structure 630 (which may be, for example, represented as a box, and may be a chip, or be contained in a chip). The external structure 630 may define a closed environment 60*b* (fluidic back-volume). A floor 630*a* of the chamber 60*a* may therefore be obtained through the external structure 630. The support structure 60, the membrane 12, the backplate 42 (if present), and the mass 22 (or 322) may be enclosed in the closed environment 60*b*. In some examples (e.g., those in which the pressure of the external environment is to be measured) some through holes (not shown in FIG. 9) may be present.

The semiconductor device 100, 200, 300, 800 (in any variant, e.g. those shown in FIG. 5*a*-5*b*, etc., or any of those disclosed below) may include at least one electric conductor (e.g. two conductors 51*a*, 51*b*, see FIG. 7), to acquire an electric signal 52 indicative of the deformation (e.g., displacement) of the membrane 12. In general terms, the at least one conductor may be applied to the membrane 12. A second conductor may be applied (in case of capacitor) to the second electrode 42, for example. For example, vias, traces and/or other electric connections may be used.

Figure 7:
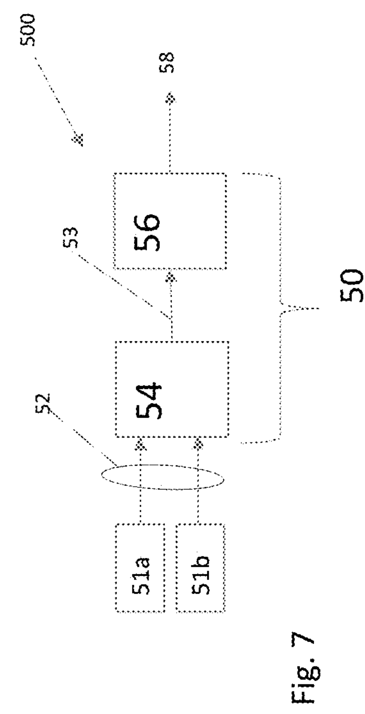
FIG. 7 shows an electric connection of a device according to the present document.

The semiconductor device 100, 200, 300 (or any one shown in FIGS. 5*a*-5*b* etc.) may operate as (or being part of) a vibration sensor or acceleration sensor, or pressure sensor (see sensor device 500 in FIG. 7, for example). The semiconductor device 100, 200, 300, 800 (e.g., those shown in Figs. etc. or any of those disclosed below) may obtain a particular electric signal 52 associated with the experienced vibration (or acceleration or pressure) in a particular range characteristic of the deformable membrane (the electric signal 52, or a processed version thereof, will then be read out, e.g. by a measurer, e.g. downstream to an analog-to-digital circuitry 54).

The sensor device 500 of FIG. 7 may be, or be part of, a voice pickup unit (VPU). The semiconductor device 100, 200, 300, 800, 1000, 1100, 1200, etc. may include circuitry 50 which may, for example, be implement application-specific integrated circuit (ASIC), or another micro-processor based system or another circuitry. The circuitry 50 may include at least one of: analog-to-digital circuitry 54 to convert the electric signal 52 indicative of the deformation of the deformable membrane 12, 312, 678, etc. onto a digital version 53 (i.e., convert analog electric signal 52 into a corresponding digital signal 53); and at least one digital measurer 56 to obtain, from the digital version 53 of the electric signal 52, a measurement 58 of at least one pressure, vibration, or acceleration.

The sensor device 500 may include a plurality of semiconductor devices (e.g., as above, 100, 200, 300, 800, etc., or below, e.g. 1000, 1100, 1200, etc.) with different displacements, weights, shapes, of the mass elements (e.g., each of them being particularly sensitive to a particular acceleration range, vibration range, or pressure range). Accordingly, a plurality of different electric signals 52 may be acquired simultaneously, and the acceleration, vibration, or pressure can be measured with increased precision through signal processing involving the different electric signals 52 obtained simultaneously. The electric signals 52 may be inputted to the analog-to-digital converter 54, which may provide the digital version 53 of the signals 52. Signal processing may be performed by the digital measurer 56 on the digital version 53 of the electric signals 52, for example. In some cases, a semiconductor device without mass element may be used (e.g., a conventional microphone or other vibration sensor) in combination with at least one or more semiconductor device(s) 100, 200, 300, 800, 1000, 1100, 1200, etc. Also, in that case, the digital signal obtained by the conventional microphone or other vibration sensor may be used to obtain the pursued measurement 58 of the acceleration, vibration, pressure, through signal processing (e.g., performed by the digital measurer 56) in combination with the electric signal(s) 52 obtained by the at least one or more semiconductor device(s) (e.g. 100, 200, 300, 800, 1000, 1100, 1200, etc.).

The semiconductor device (e.g., 100, 200, 300, 800, 1000, 1100, 1200, etc.) may be associated, e.g. in the same structure (e.g., in the same chip) with a multiplicity of other semiconductor devices, each having at least one deformable membrane (which may be similar to the membrane 12), and all the semiconductor devices can operate synchronously, e.g. by sensing a vibration, an acceleration, or a pressure, simultaneously (e.g., in such a way that different semiconductor devices are sensitive to different ranges of acceleration, vibration, pressure). Different membranes of different semiconductor devices in the same structure (e.g., same chip) may have the same shape, or different shapes. Different membranes of different semiconductor devices in the same structure (e.g., same chip) may have different numbers of mass elements, or the same number of mass elements. Different membranes of different semiconductor devices in the same structure 60 (e.g., same chip) may be simultaneously subjected to different displacements even when the sensor 500 is experiencing the same vibration (or acceleration or pressure). Therefore, each different semiconductor device among the multiplicity of semiconductor devices in the same sensor device may be susceptible to (or particularly sensitive to) a different ranges of vibration, acceleration or pressure. It is also possible that the same sensor device that hosts the semiconductor device 100, 200, 300, 800, 1000, 1100, 1200 (e.g., those shown in FIGS. 5*a*-5*b*, etc.) also comprises different semiconductor device(s) (e.g., at least one microphone or another semiconductor device which is not like the semiconductor device 100, 200, 300, e.g. those shown in FIGS. 5*a*-5*f*, etc.; for example, it may lack a mass element, operating such as a traditional microphone). The semiconductor device 100, 200, 300, 800, 1000, 1100, 1200, etc. (or the sensor device comprising the semiconductor device) may be used, in particular, for a voice pickup unit (VPU) for picking up vibration signals from bone during speech (which may be an example of the sensor device). The semiconductor device may be used for sensing inertial forces.

Figures 6A, 6B:
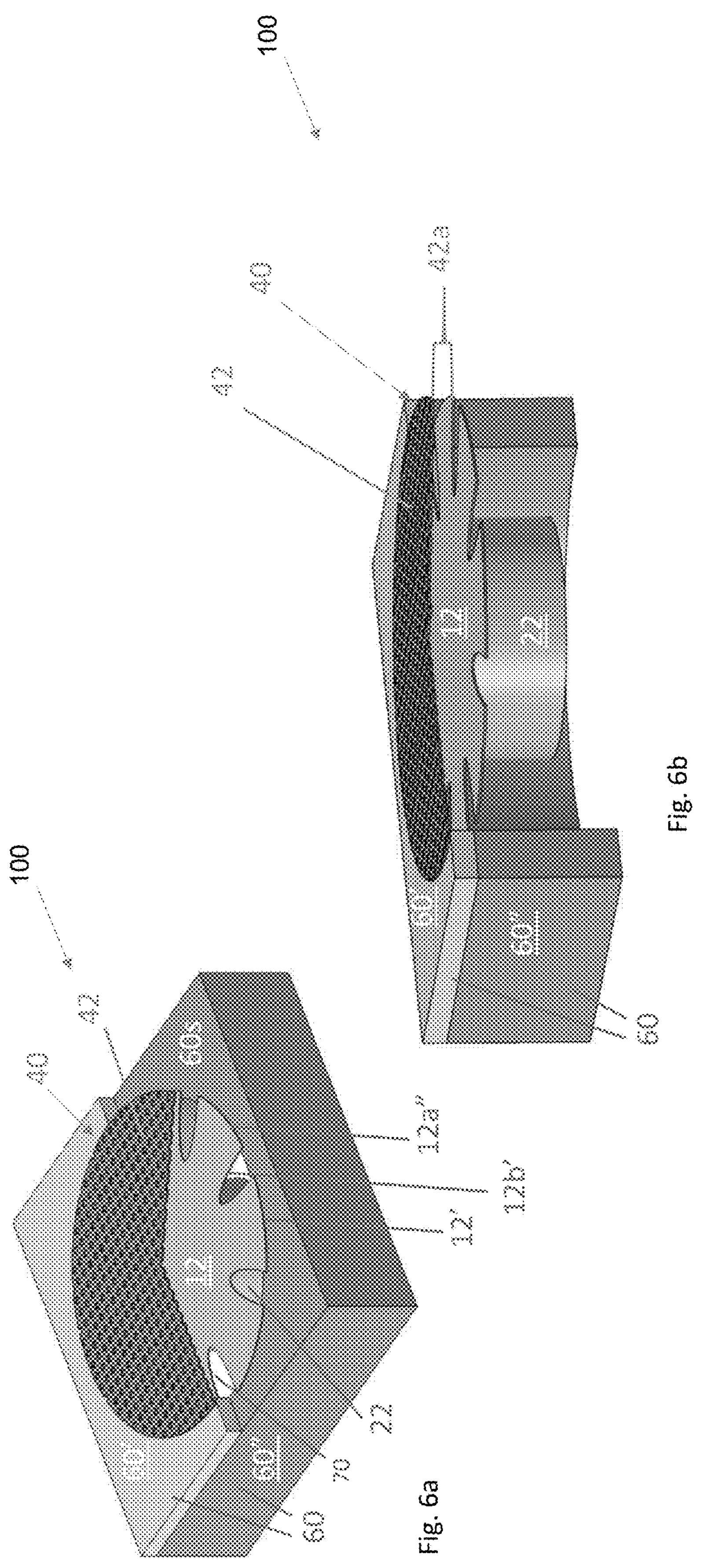
FIGS. 6*a* and 6*b* show elements of a semiconductor device which may be one of FIG. 1*a*, 1*b* or 2 in partially cross-sectioned perspectives.

In the examples above the semiconductor device 100, 200, 300, 800 (e.g., those shown in FIGS. 5*a*-5*b*, 6*a*, 6*b*, 8*a*, 8*b*, etc.) often comprises a capacitor 40 with variable capacitance. A three-dimensional example is provided in FIGS. 6*a* and 6*b*. The semiconductor device may be of the single backplate type (the backplate embodying the second electrode 42), but in some examples it may have multiple backplates (e.g., the membrane 12 being interposed between the two backplates). The capacitor 40 has at least one first electrode (which is, or is part of, or comprises the deformable membrane 12) and at least one second electrode 42 (which in this case is fixed and/or non-displaceable, since it does not deform with vibration, acceleration or pressure), which are separated through a gap 42*a* (FIG. 6*b*). The deformable membrane 12 may be in conductive material, or may have at least one conductive layer (e.g., metal or highly-doped semiconductor material). The capacitor 40 formed by the deformable membrane 12 and the second electrode 42 therefore has a dielectric gap 42*a* therebetween.

The gap 42*a* is modified in consequence of the deformation (e.g., displacement) of the membrane 12. Hence, the gap 42*a* results associated with the vibration, acceleration, or pressure to which the deformable membrane 12 is subjected. The modification of the dielectric gap 42*a* (change of the distance between the deformable membrane 12 and the second electrode 42) accordingly causes a variation of the capacitance of the capacitor 40. The electric signal 52 is therefore subjected to the instantaneous variation of the capacitance of the capacitor 40 and, therefore, also provides information on the vibration, acceleration, or pressure to which the deformable membrane 12 is instantaneously subjected. The electric signal 52 is therefore indicative of the pressure, acceleration, or vibration acting on the deformable membrane 12. In particular when operating for sensing a pressure, the second electrode 42 may have at last one through hole (e.g., a plurality of holes or perforations 42', such as a matrix of holes like in FIG. 2), e.g. to permit the pressure (e.g., sound) to arrive at least at the second side 1213, of the deformable membrane 12 (as shown in FIG. 3, also in the case in which the second electrode 42 is more internal than the deformable membrane 12 there may be made at least one hole 42', more probably a plurality of holes 42', or perforations). It is intended that the second electrode 42 may be (or at least have a layer) made of conductor material (e.g., metal) or highly doped semiconductor material. FIG. 6*a* shows a cover 60' which is part of the support structure 60 (in the examples of FIGS. 1 and 3 the cover 60' is not shown, but may be notwithstanding present). The cover 60' may, in some examples, sandwich the membrane border 12' (and in particular the at least one contacting membrane border portion 12*a*") onto a first part (first block) 60" of the support structure 60.

Figures 15A, 15B:
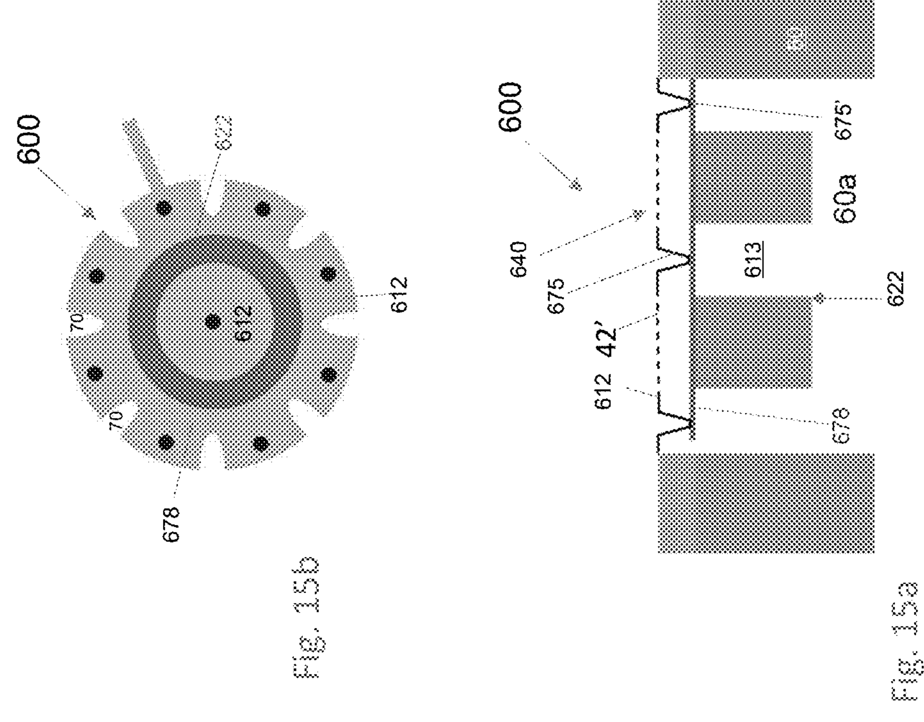
FIG. 15*a* shows a view in a protrusion direction of another example of the semiconductor device.
FIG. 15*b* shows a view in planar directions of the example of FIG. 10*a*.

With reference to FIGS. 15*a* and 15*b*, a semiconductor device 600 includes the deformable membrane 678 and a backplate 612 (which may be an example of the second electrode 42). The backplate 612 is stiff, while the membrane 678 is deformable. The deformable membrane 678 (which substantially plays the role of the deformable membrane in the examples above, e.g. the membrane 12 in FIGS. 1*a* and 1*b*) and the backplate 612 (which may play the role of the second electrode 42) may form, for example, a capacitor 640 (example of the capacitor 40). At least one support post 675 (e.g., in a position corresponding to the central position of the membrane 678) may permit the backplate 612 to keep in position the membrane 678, e.g. by contact and/or by mechanical connection. Further support posts may be in lateral positions (e.g., to fix the membrane 678 to the structure 60). The support post(s) may be in dielectric material or non-doped semiconductive material, so as to avoid electric contacts between the membrane 678 and the backplate 612. The backplate 612 may be supported by (e.g., clamped by) the structure 60 (e.g., through support post(s)). The membrane 678 (which supports, attached thereto or integral therewith, the at least one mass element 622) may be like the membrane 12 as any of the examples above, and may be, for example, elastically supported by the structure 60. The membrane 678 may substantially be floating. The membrane 678 may be fixed to the structure 60 e.g. through at least one beam 675' (e.g., in the peripheral position of the membrane, e.g. also connected to a support post of the backplate 612, which in turn is mechanically connected to the structure). The backplate 612 may have through holes (perforations) 42' (like in FIGS. 1*a*, 1*b*, 6*a*, 6*b*, 8*a*, and 9). Due to the presence of the at least one support post 675 in central position, the membrane 678 may deform in a donut-like fashion. The at least one mass element 622 may also have a hole (which may be a though hole) 613 in central position. The hole 613 of the at least one mass element 622 (in particular when there is only one single mass element 622, or at least when there is one mass element in central position of the membrane 678) may be in correspondence of the at least one central support post 675. All the examples above (including the material of the mass element 622 in metal or in semiconductor material, the thickness, the shape of the first membrane 678, the possibility of being inserted in the external structure 630, etc.) may also be present in the example of FIGS. 15*a* and 15*b*. In these examples, the membrane 678 has still an elastic connection with the structure 60. In this case, the aperture(s) 70 may be present or not present. The border of the membrane 678 can be (but in some example is not necessarily) in contact with the structure 60.

The present examples may also be applied to the case in which the semiconductor device 100, 200, 300, 800 (e.g., one of the variants shown in FIGS. 5*a*-5*b*, etc.) does not include the capacitor 40 (and the second electrode 42), but, still, the electric signal 52 provides information on the vibration, acceleration, pressure. For example, if the semiconductor device 100, 200, 300, 800 (e.g., those shown in FIGS. 5*a*-5*b*, etc.) is of the piezoelectric type, then the membrane includes a piezoelectric membrane in a piezoelectric material, and is electrically connected to the electric conductors 51*a*, 51*b*. The piezoelectric membrane causes the variation of the electrical signal 52. The electric conductors may be, in that case, applied to in different sides (e.g., counter posed with each other) of the piezoelectric membrane: for example, the conductor 51*a* could be connected to the second, external side 12*e*, and conductor 51*b* could be connected to the first, internal side 12*i* of the piezoelectric membrane. In the case of piezoelectric membrane, then the element 42 of FIGS. 1*a* and 2 and the element 342 of FIG. 3 is not present. Some examples are provided here below.

Figures 10A, 10B, 11A, 11B, 12:
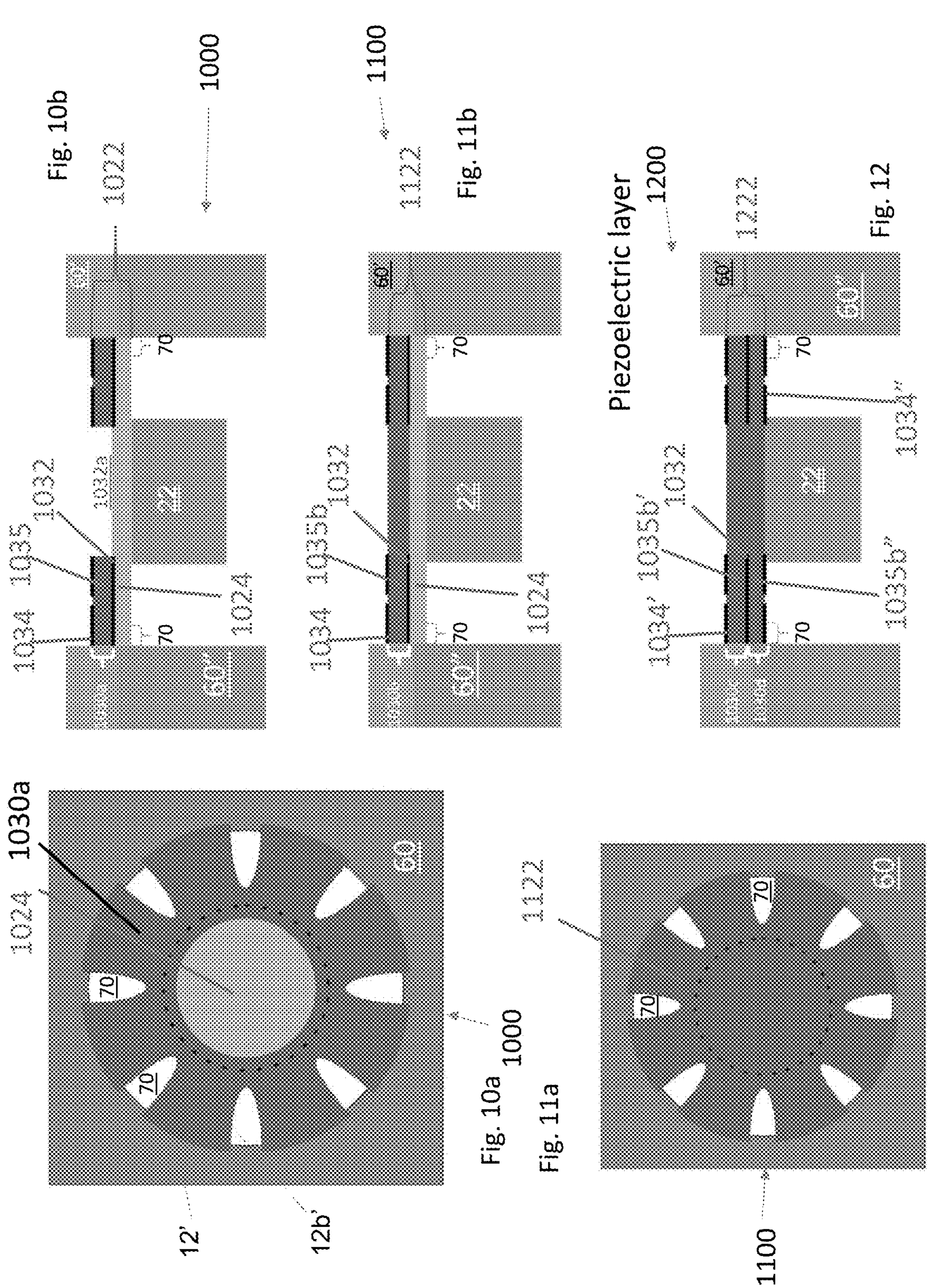
FIG. 10*a* shows a view in a planar direction of another example of the semiconductor device.
FIG. 10*b* shows a view in the protrusion direction of the example of FIG. 10*a;*
FIG. 11*a* shows a view in a planar direction of another example of the semiconductor device.
FIG. 11*b* shows a view in the protrusion direction of the example of FIG. 11*a;*
FIG. 12 shows another example in the protrusion direction of a semiconductor device.

FIGS. 10*a* and 10*b* show a different example 1000 in which, instead of implementing the capacitor 40, a piezoelectric technique is used. As can be seen from FIGS. 10*a* and 10*b*, the deformable membrane is a piezoelectric membrane 1022. The piezoelectric membrane 1022 may be cantilevered to the structure 60. At least one mass element 22 is attached to (e.g., clamped to) the membrane 1022. The membrane 1022 is provided with the at least one supporting connection which includes the at least one elastic supporting connection. Also, in this case, the elastic supporting connection is obtained by partially separating the support structure 60 from the membrane 12 (e.g., using the aperture 70, which partially separates some portions 12*b*' of the membrane border 12' of the membrane, thereby increasing the elasticity to reduce stiffness). Basically, all the discussion above for the previous examples may be maintained (including the geometrical properties of the membrane and the apertures), even though instead of the elements of the capacitive technique, there is implemented a piezoelectric technique. As can be seen from FIGS. 10*a* and 10*b*, the membrane 1022 may include at least one piezoelectric layer 1030*a*. In this case, the at least one piezoelectric layer 1030*a* includes an elastic sublayer 1035 and at least one piezoelectric sublayer 1032, 1034. The two piezoelectric sublayers 1032 and 1034 are separated from each other by the sublayer 1035, which may be a non-piezoelectric layer, but is a deformable layer. A central hole (e.g., through hole) 1032*a* may be present in the center position of the piezoelectric sublayer 1030*a* (e.g., corresponding to the position of the mass element 22). A support layer 1024 (in deformable material) may also be present and stapled to the piezoelectric sublayer 1030*a*. The piezoelectric sublayer 1038 can be sustained by the support layer 1024. The at least one mass element 1022 may be in contact (e.g., integral) with the support layer 1024. The vibration, under the influence of the inertia of the at least one mass element 1022, deforms both the support membrane 1024 and the piezoelectric membrane 1030*a* (including the sublayers 1032, 1034, 1035) so as to cause the insurgence of the piezoelectric effect in piezoelectric sublayers 1032 and 1034, so that the electric signal 52 is acquired.

FIGS. 11*a* and 11*b* show another example 1100. In this example, the membrane 1122 may include, together with the support layer 1024, also a piezoelectric sublayer 1030*b* which lacks of the central hole 1032*a* of FIGS. 10*a* and 10*b* (for the rest, it is the same example). It is to be noted, notwithstanding, that both the layers 1024 and 1030*b* comprise the apertures 70 in the same way as described for the device 1000 discussed above. In this case, similarly to the example 1000, also the piezoelectric layer 1030*b* comprises at least one (preferable two) piezoelectric sublayers 1032, 1034 separated by each other through 1035*b*.

Another example 1200 is shown in FIG. 12. In this case, the support layer 1024 is not present (but it can be present in some examples). The membrane 1222 here comprises one single piezoelectric layer which is separated between at least two piezoelectric sublayers 1030*c* and 1030*d* each stapled one over the other. The first piezoelectric layer 1030*c* may include at least one (preferably two) piezoelectric sublayers 1034' and 1032 separated from each other by the non-piezoelectric sublayers 1035*b*' and 1035*b*". The second layer 1030*d* may include a first piezoelectric layer 1035*b*". The piezoelectric layer 1035*b*" may separate the sublayer 1034" from the sublayer 1032.

It is to be noted that the variants of FIGS. 2, 3, 5*a*-5*b*, etc. are also valid for the piezoelectric versions, once the membrane 12 of 2, 3, 5*a*-5*b* is substituted by a piezoelectric membrane (e.g., 1022, 1122, 1222) and the second electrode 42 or 342 is not present.

In some cases, instead of using a capacitive technique or a piezoelectric technique, a piezoresistive technique may be used. For example, the electric signal 52 may be subjected to the resistance of the membrane 12 (which here operates as a resistor with variable resistance). The resistance of the membrane 12 varies with the deformation (e.g., if the shape of the membrane is more arcuate, then the resistance is increased, and, and if the shape is more flat, then the resistance is decreased). In this case, the membrane, which is in piezoresistive material (e.g., doped semiconductor material) will be subjected to a measurement through the conductors 51*a* and 51*b*) in different portions thereof (e.g., in two different portions of the membrane border 12'). The electrode 42 is in this case not necessary.

Figures 13A, 13B:
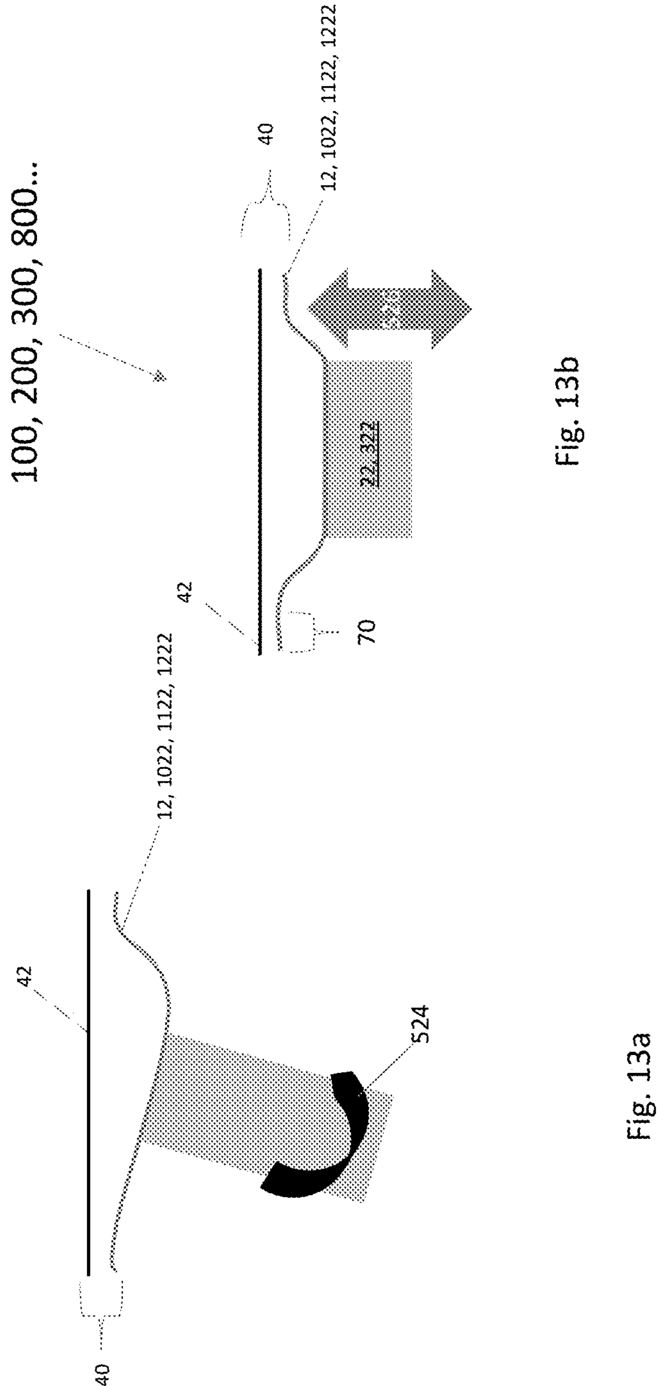
FIG. 13*a* shows an operation of a semiconductor device according to the conventional aft.
FIG. 13*b* shows an operation of a device according to the present document.

Reference can be now made to FIG. 13*a* (showing a conventional technique) and FIG. 13*b* (showing a technique proposed in the present document). The conventional technique requires the mass element to be very elongated in the protrusion direction (vertical in FIGS. 13*a* and 13*b*), to increase inertia without increasing stiffness too much, but causing unwanted tilting modes 524. On the contrary, with the present technique (shown in FIG. 13*a*), in view of the elasticity obtained through the elastic supporting connection, it is possible to reduce the elongation of the at least mass element 22, 222, 322 (22*a*, 22*d*, etc.) in the protrusion direction and to increase the elongation(s) in the planar direction(s) (parallel to the extension of the membrane 12). Hence, the center of mass of the at least mass element 22, 322 is closer to the membrane 12, which facilitates reaching a piston mode 526 at lower frequencies than the tilting mode.

Figure 14A:
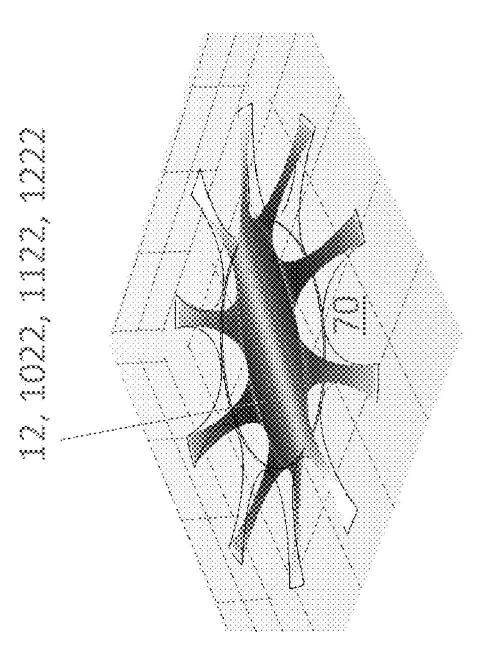
FIG. 14*a* shows a simulation of the behavior of a semiconductor device in tilting mode.
Figure 14B:
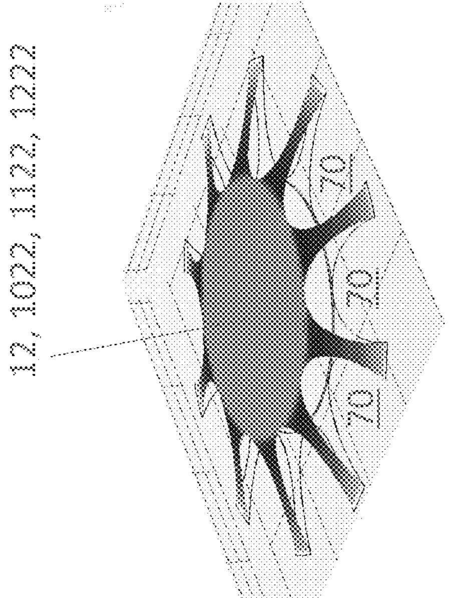
FIG. 14*b* shows the behavior of a device in piston mode.

FIGS. 14*a* and 14*b* show simulations on the claimed example. In this case, the position of the at least one mass element 22, 322 (which is not shown) is over the membrane (like in FIG. 3), but analogous results would be obtained with the other examples. In FIG. 14*b* there is simulated the membrane 12 moving according to the piston mode. Thanks to its elastic supporting connection, for its greater extension, the membrane 12 is deformed uniformly. On the other side, FIG. 14*a* shows the simulation of a tilting mode. FIGS. 14*a* and 14*b* show the better mode separation due to the stockiness of the mass element, as achieved thanks to the present techniques. The piston mode (FIG. 14*b*) is around 6 kHz, whereas the tilting mode (FIG. 14*b*) occurs at much higher frequencies (around 12 kHz). In sharp contrast, in conventional technique (with a more elongated mass) the tilting mode would occur at a lower frequency. For example, in the conventional techniques the tilting mode would occur at a frequency closer to the frequencies at which the piston mode occurs, or even at a lower frequency in some cases.

Without exceeding in mathematical formalisms, in an oscillating system (such as a system formed by the at least one mass element 22, 222, 322, 22*a*, 22*d*, etc. and the membrane 12), the resonance frequency $f_r$ is given by $$f_r = \frac{1}{2 \cdot \pi} \cdot \sqrt{\frac{K}{m}}$$

(or more in general by a relationship according to which $f_r$ is proportional to $$\sqrt{\frac{K}{m}}\bigg),$$

where K is the effective elastic stiffness of the membrane 12, and m is the effective mass of the at least one mass element (e.g., 22, 322, 22*a*, 22*d*, etc.) and the membrane 12. If the elastic stiffness K is reduced (e.g., by virtue of the aperture(s) 70), then the resonance frequency $f_r$ is accordingly reduced. Further, also the mass m of the at least one mass element may be accordingly reduced, since this is permitted by the reduction of the stiffness K. This permits, inter alia, to make the mass element in metal material, which was previously impracticable. On the other side, in order to reduce the frequency $f_r$, we don't need to increase the mass (but we can ever reduce it), because we can rely on the reduction of the stiffness K.

Notably, there is also the opportunity of using, for the mass element(s), heavy materials (e.g., metals) instead of silicon-based materials. By using metals, it is possible to define a height (elongation in the protrusion direction) which is even less than 10 μm (micrometers). In this case, the use of metals is extremely advantageous (its thickness deposition capabilities is not high, and it is often below 50 μm, micrometers, or 30 μm, micrometers, or 20 μm, micrometers, according to particular application). The use of metals is preferably based on a structuring process like lifting-off. Even if etching may be used also for metals, it is easier and more accurate than e.g. Bosch etching semiconductor materials.

In many of the examples above it has been explained that, thanks to the increased elasticity of the supporting connection, the stockiness may be increased. However, advantages are also obtained even without changing the dimensions of the mass element(s). In fact, the increased elasticity permits notwithstanding to reduce stiffness, thereby reducing the risk of breakage, thereby increasing reliability.

In the present examples, the thickness of the at least one mass element 322, when implemented in metal, may be less than 100 μm (micrometers), e.g. thicker than 1.5 and/or less thick than 30 (e.g., between 5 and 15, or between 1.5 and 20) μm (micrometers). The thickness of the at least one mass element 22, 222, 22*a*, 22*d*, etc. when implemented in semiconductor material (e.g., silicon based material) may be less than 350 μm (micrometers), e.g. larger than 50 and/or less than 300 μm (micrometers). The thickness is in the protrusion direction: if the at least one mass element is a cylinder, the thickness is the height of the cylinder and is elongated along the protrusion direction (e.g., vertical in FIG. 1*a*) (while the circumference of the cylinder is along the planar directions). The thickness of the membrane (e.g., 12, 1022, 1122, 1222, 678) may be greater than 200 nm (micrometers) and/or less than 10 μm (micrometers), e.g. less than 5 μm (micrometers).

A height to radius ratio of the mass element may preferably be in the range from 0.1 to 1 for semiconductor materials and 0.005 to 0.25 for metals (the radius extending in planar direction, the height extending in the protrusion direction). In case of non-cylindrical mass element, the radius is the radius of the circle having the same area of the area of the surface of the mass element, with the possible use of shape factor associated to the shape of the surface of the mass element.

It is possible to make the semiconductor device 100, 200, 300, 800, 1000, 1100, 1200 (or any of those shown in FIGS. 5*a*-5*b*, etc.) by implementing a method such as: making: a support structure (e.g., 60) (or more in general the structure 630, such as the chip), and a deformable membrane (e.g., 12) supported by the support structure (e.g., 60) through at least one supporting connection, in such a way that the at least one supporting connection includes at least one elastic connection, the at least one mass element (e.g., 22, 222, 322, 22*a*, 22*d*) being attached to, or integral with, the deformable membrane (e.g., 12); and electrically connecting the deformable membrane (e.g., 12) to circuitry (e.g., so), the circuitry being configured to acquire an electric signal (e.g., 52) indicative of the deformation of the membrane (e.g., 12, 1022, 1122, 1222) conditioned by the movement of the at least one mass element (e.g., 22, 222, 322, 22*a*, 22*d*, 1022, 1122, 1222 etc.).

In the cases in which the at least one mass element (e.g., 22, 222, 22*a*, 22*d*, 1022, 1122, 1222 etc.) is not in metal material, it is advantageous if the block portion (first block) 60" of the support structure 60 and the at least one mass element are made from the same block of silicon-based material (precursor of the block portion 60" and of the at least one mass element), e.g. Si substrate and/or polysilicon. Even though the at least one mass element and the block portion 60" are detached in the final product, they may advantageously be generated from one single block by removing the material which occupies the volume which is finally occupied by the chamber 60*a*.

It is advantageous if the membrane 12 is made by deposition (e.g., deposition of polysilicon) on the block portion 60" of the support structure 60 or on the precursor of the block portion 60" and of the at least one mass element.

It is advantageous if the cover 60' of the support structure 60 is made by depositing material (e.g., semiconductor material) on the block portion 60" of the support structure 60 or on the precursor of the block portion 60" and of the at least one mass element. The membrane 12 (and in particular the border 12', e.g. in correspondence of the 12*b'* contacting membrane border portions 12*a"*) may therefore be sandwiched between the block portion 60" and the cover 60'.

It is advantageous if the membrane 12 is structured (e.g., by etching, such as plasma or wet etching), by removing material of the membrane 12 in correspondence of the aperture(s) 70 and/or of the slit(s) 70*a*. It is particularly advantageous to make the slits 70*a* (in case they are required) after the membrane is applied to the structure 60, because the flaps 870 (which are originally part of the membrane) are subsequently separated from the membrane, and end being part of the support structure 60.

It is advantageous if the structuring of the at least one mass element and/or the removing of material from the precursor of the block portion 60" and of the at least one mass element is performed after the membrane being deposited. The perforation of the mass element (e.g., to obtain the hole 222) may be also performed by etching in this step.

In the case of the at least one mass element (e.g., 322) being in metal material, it is possible to perform metal deposition, such as metal plating, e.g. electro plating, e.g. based on electrolysis. This is a much preferable technique than Bosch etching, because this technique permits achieving a greater precision. It is also possible to perform physical vapor deposition (PVD), e.g. performed in a vacuum. PVD is also more precise than Bosch etching (e.g., obtain through passages of sputtering and evaporation). It is noted that even in the case of the at least one mass element being in metal material, an etching step may be in some examples performed, to define the lateral shape of the at least one mass element. However, the processes used for etching the metal material are more precise that Bosch etching.

In particular in the case in which the semiconductor device includes a capacitor (40) with variable capacitance, the method may include making the second electrode (42) before, and in a more internal position than, the membrane (12). The at least one mass element may therefore be made more external than the membrane. Layer growth may be used, which is a particularly precise technique. This technique permits to use layer growth (or other methods) for making the metal layer 322, in particular in external position like in FIG. 3.

Electric connections may be performed e.g., by making vias and/or traces (or other electric connections), for example, on the structure 60, and more in general by connecting the membrane (and, in case, also the second electrode 42) to circuitry 50 for processing the obtained signal 52.

The sensor 500 may be manufactured by connecting the electric connections to analog-to-digital circuitry 54, which has the role of converting the electric signal 52 indicative of the deformation of the membrane 12 onto a digital version 53. The output of the analog-to-digital circuitry 54 may be electrically connected to at least one digital measurer 56 to obtain, from the digital version 53 of the electric signal 52, the measurement 58 of at least one of pressure, vibration, or acceleration. In some cases, the circuitry 50 is integrated in one single structure (e.g., one chip), and therefore the analog-to-digital circuitry 54 and the at least one digital measurer 56 may be embodied by the same single structure.

What is claimed is:

1. A semiconductor device comprising:

a deformable membrane with a membrane stiffness;

a support structure;

at least one electric contact configured to obtain an electric signal indicative of a deformation of the deformable membrane; and at least one mass element attached to, or integral with, the deformable membrane, wherein the deformable membrane comprises a membrane border that is partially in direct contact with the support structure and partially separated by at least one aperture from the support structure.

2. The semiconductor device of claim 1, wherein the at least one mass element partially overlaps with the at least one aperture.

3. The semiconductor device of claim 1, further comprising at least one flap separated from the deformable membrane and supported by the support structure, each flap partially occupying at least one aperture.

4. The semiconductor device of claim 1, wherein the at least one mass element comprises one single mass element with a central hole.

5. The semiconductor device of claim 1, wherein the at least one mass element comprises a metal material.

6. The semiconductor device of claim 1, wherein the at least one mass element has a thickness less than 300 μm (micrometers).

7. The semiconductor device of claim 1, wherein the at least one mass element is subjected to a movement to generate at least one translatory oscillating mode.

8. The semiconductor device of claim 1, wherein a center of mass of the at least one mass element is in a centered position of the deformable membrane.

9. The semiconductor device of claim 1, wherein the semiconductor device is a capacitor with a variable capacitance, the capacitor comprising:

at least one first electrode; and at least one second electrode, wherein the at least one first electrode includes the deformable membrane, wherein the capacitance is variable based on a deformation of the deformable membrane and a movement of the at least one mass element, and wherein the capacitor is configured to provide the electric signal based on the capacitance.

10. The semiconductor device of claim 9, wherein the at least one second electrode includes a backplate.

11. The semiconductor device of claim 1, wherein the deformable membrane includes a piezoelectric layer, and wherein the at least one electric contact includes a first electric contact and a second electric contact electrically connected to opposite sides of the piezoelectric layer.

12. A sensor device comprising:

a semiconductor device including:

a deformable membrane with a membrane stiffness;

a support structure;

at least one electric contact configured to obtain an electric signal indicative of a deformation of the deformable membrane; and at least one mass element attached to, or integral with, the deformable membrane, wherein the deformable membrane comprises a membrane border that is partially in direct contact with the support structure and partially separated by at least one aperture from the support structure;

analog-to-digital circuitry configured to convert the electric signal indicative of the deformation of the deformable membrane into a digital signal; and at least one digital measurer configured to obtain, from the digital signal, a measurement of at least one pressure, vibration, or acceleration.

13. The sensor device of claim 12, further comprising a plurality of semiconductor devices having different displacements, weights and shapes, of the respective at least one mass elements.

14. The sensor device of claim 12, wherein the sensor device is a voice pickup unit (VPU), and wherein the VPU is configured to pick up vibration signals from bone during speech.

15. The semiconductor device of claim 12, wherein the at least one mass element partially overlaps with the at least one aperture.

16. A semiconductor device comprising:

a deformable membrane with a uniform thickness;

a support structure;

at least one electric contact configured to obtain an electric signal indicative of a deformation of the deformable membrane; and at least one mass element attached to the deformable membrane, wherein the deformable membrane comprises a membrane border that is partially in direct contact with the support structure and partially separated by at least one aperture from the support structure.

17. The semiconductor device of claim 16, wherein the deformable membrane consists of a single layer.

18. The semiconductor device of claim 17, wherein the deformable membrane consists of a doped or undoped semiconductive material or a metal material.

19. The semiconductor device of claim 16, wherein the deformable membrane comprises a plurality of layers.

20. The semiconductor device of claim 16, wherein the at least one mass element partially overlaps with the at least one aperture.

* * * * *